United States Patent
Huang

(10) Patent No.: US 12,142,328 B2
(45) Date of Patent: Nov. 12, 2024

(54) ERASING AND ERASING VERIFICATION FOR THREE-DIMENSIONAL NAND MEMORY

(71) Applicant: Yangtze Memory Technologies Co., Ltd., Hubei (CN)

(72) Inventor: Kaijin Huang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 119 days.

(21) Appl. No.: 17/950,810

(22) Filed: Sep. 22, 2022

(65) Prior Publication Data

US 2024/0112742 A1  Apr. 4, 2024

(51) Int. Cl.
- *G11C 16/16* (2006.01)
- *G11C 16/08* (2006.01)
- *G11C 16/34* (2006.01)

(52) U.S. Cl.
CPC .......... *G11C 16/3445* (2013.01); *G11C 16/08* (2013.01); *G11C 16/16* (2013.01)

(58) Field of Classification Search
CPC ..... G11C 16/3445; G11C 16/08; G11C 16/16; G11C 11/5635; G11C 16/0483
See application file for complete search history.

(56) References Cited

U.S. PATENT DOCUMENTS

2016/0111165 A1* 4/2016 Shim ................. G11C 11/5635
                                                     365/185.11

* cited by examiner

*Primary Examiner* — Xiaochun L Chen
(74) *Attorney, Agent, or Firm* — Conley Rose, P.C.

(57) ABSTRACT

The present disclosure provides a method of erase and erase verification for a memory device. The method includes applying a first erase voltage to erase memory cells of the memory device. The first erase voltage is incrementally increased by a first erase step voltage until the memory cells pass an initial erase verification. The method also includes determining whether the memory cells pass or fail sub-erase verifications by applying sub-erase verification voltages. The method further includes applying a second erase voltage to erase the memory cells after the sub-erase verifications. The second erase voltage is increased from the first erase voltage by a second erase step voltage, which is smaller than the first erase step voltage and is determined according to whether the memory cells pass or fail the sub-erase verifications.

20 Claims, 9 Drawing Sheets

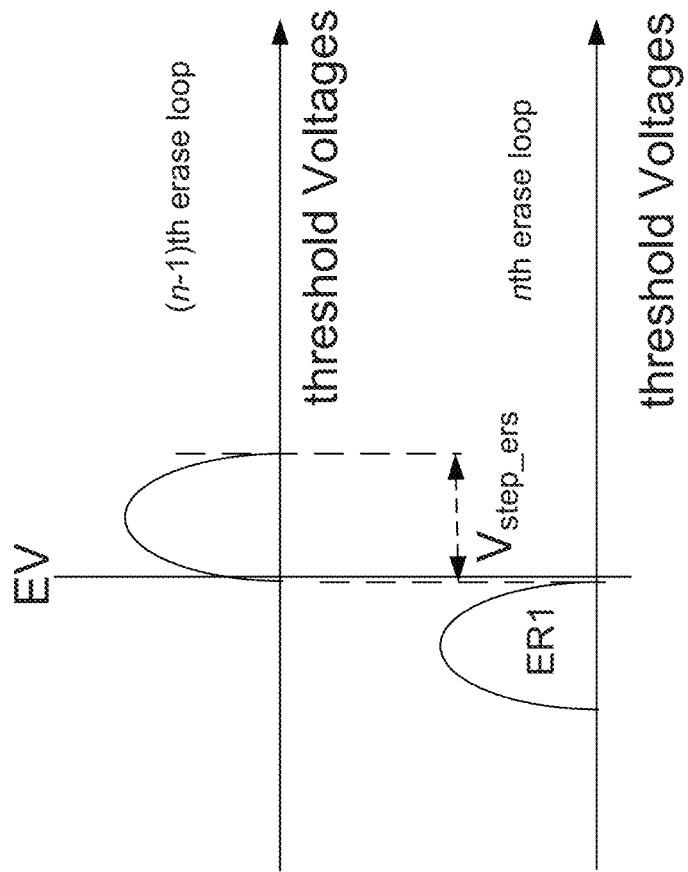
FIG. 5(c)
FIG. 5(d)
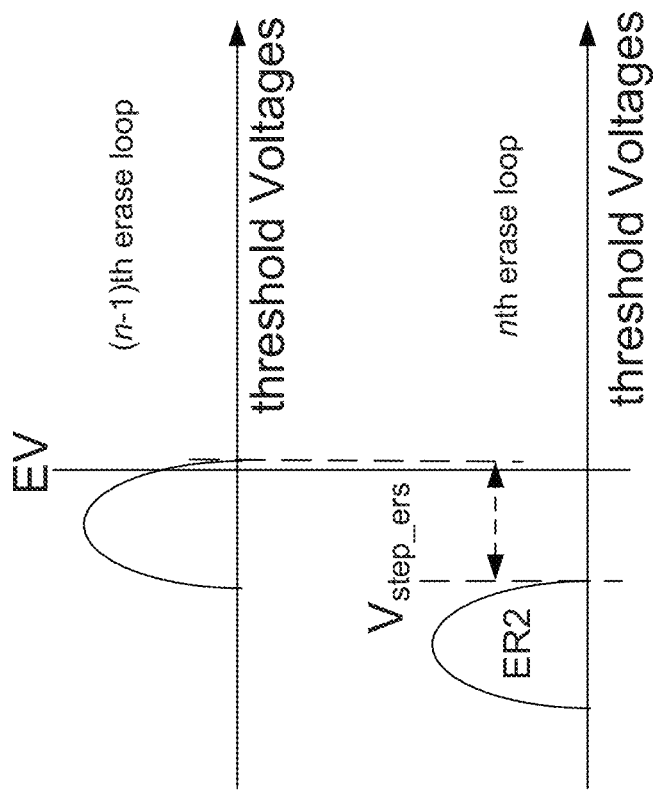
FIG. 5(a)
FIG. 5(b)

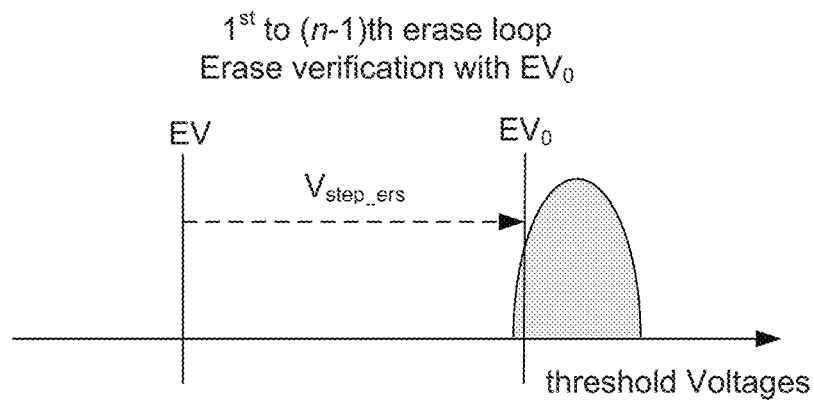
FIG. 7(a)
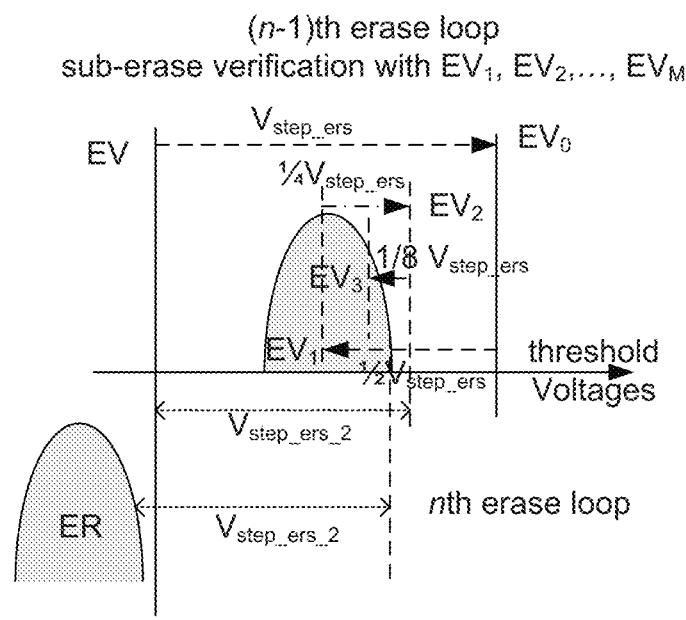
FIG. 7(b)
FIG. 7(c)

ERASING AND ERASING VERIFICATION FOR THREE-DIMENSIONAL NAND MEMORY

TECHNICAL FIELD

The present disclosure generally relates to the field of semiconductor technology, and more particularly, to a method of erase and erase verification for a NAND flash memory.

BACKGROUND

In many servers and mobile devices, NAND flash memory is widely used as the primary non-volatile storage device due to its high storage density and relatively low access latency. To increase storage capacity, in a state-of-art NAND flash memory, each memory cell can store multiple bits and have multiple states. For example, in a triple-level-cell (TLC) mode, each memory cell can have eight states. While programming and reading operations can be performed for all the memory cells that share a word line in a memory page, an erase operation is usually performed for all of the memory cells in a memory block that share a common source line. Because various memory cells can be at different states and different memory blocks can experience different endurance after cycles of erasing, applying an erase voltage with a predetermined magnitude and a predetermined incrementing step voltage can result in either deep erase or shallow erase of the various memory cells.

BRIEF SUMMARY

Embodiments of an improved erase and erase verification method for a NAND flash memory are described in the present disclosure.

One aspect of the present disclosure provides a method of erase and erase verification for a memory device. The method includes applying a first erase voltage to erase memory cells of the memory device, where the first erase voltage is incrementally increased by a first erase step voltage until the memory cells pass an initial erase verification using an initial erase verification voltage that is higher than an erase verification voltage by the first erase step voltage. After the memory cells pass the initial erase verification, it is determined whether the memory cells pass or fail sub-erase verifications by applying sub-erase verification voltages, where the sub-erase verification voltages are in a range between the erase verification voltage and the initial erase verification voltage. The method also includes applying a second erase voltage to erase the memory cells after the sub-erase verifications. The second erase voltage is increased from the first erase voltage by a second erase step voltage. The second erase step voltage is smaller than the first erase step voltage and is determined according to whether the memory cells pass or fail the sub-erase verifications.

In some embodiments, the method further includes, after applying the second erase voltage to erase the memory cells, determining whether the memory cells pass or fail an ultimate erase verification using the erase verification voltage.

In some embodiments, the method further includes determining that the memory cells fail the initial erase verification when threshold voltages of the memory cells are higher than the initial erase verification voltage; and determining that the memory cells fail the ultimate erase verification when the threshold voltages of the memory cells are higher than the erase verification voltage.

In some embodiments, the method further includes applying the initial erase verification voltage or the erase verification voltage to word lines coupled to the memory cells.

In some embodiments, the method further includes completing the erase and erase verification for the memory device when the memory cells pass the ultimate erase verification.

In some embodiments, the determining whether the memory cells pass or fail sub-erase verifications comprises performing M number of sub-erase verification operations using M number of sub-erase verification voltages after the memory cells pass the initial erase verification. M is a first whole number not smaller than 1; and a first sub-erase verification voltage is the initial erase verification voltage subtracting a half of the first erase step voltage.

In some embodiments, the method further includes decreasing an ith sub-erase verification voltage from an (i−1)th sub-erase verification voltage by a first product of the first erase step voltage and $1/2^i$ when the memory cells pass an (i−1)th sub-erase verification; and increasing the ith sub-erase verification voltage from the (i−1)th sub-erase verification voltage by the first product of $$\frac{1}{2^i}$$

and the first erase step voltage when the memory cells fail the (i−1)th sub-erase verification, wherein i is a second whole number greater than 1 but not larger than M.

In some embodiments, the method further includes determining that the memory cells fail the (i−1)th sub-erase verification when threshold voltages of the memory cells are higher than the (i−1)th sub-erase verification voltage.

In some embodiments, the method further includes determining that the second erase step voltage is an Mth sub-erase verification voltage subtracting the erase verification voltage when the memory cells pass an Mth sub-erase verification; and determining that the second erase step voltage is the Mth sub-erase verification voltage subtracting the erase verification voltage and adding a second product of $$\frac{1}{2^M}$$

and the first erase step voltage when the memory cells fail the Mth sub-erase verification.

In some embodiments, the applying the first erase voltage or the second erase voltage to erase the memory cells includes applying the first erase voltage or the second erase voltage to an array common source of the memory cells; and grounding word lines coupled to the memory cells.

Another aspect of the present disclosure provides a memory device, which includes a memory block having a plurality of memory cells and a plurality of word lines and bit lines, wherein each memory cell is coupled to a word line and a bit line. The memory device can also include a control circuit configured to send control signals for performing erase and erase verification operations for the memory block. The control signals when executed cause the memory device to apply a first erase voltage to erase the memory block. The first erase voltage is incrementally increased by a first erase step voltage until the memory block passes an initial erase verification using an initial erase verification voltage that is higher than an erase verification voltage by the first erase step voltage. The control signals when executed also cause the memory device to determine whether the memory block passes or fails sub-erase verifications by applying sub-erase verification voltages after the memory block passes the initial erase verification. The sub-erase verification voltages are in a range between the erase verification voltage and the initial erase verification voltage. The control signals when executed also cause the memory device to apply a second erase voltage to erase the memory block after the sub-erase verifications. The second erase voltage is increased from the first erase voltage by a second erase step voltage that is smaller than the first erase step voltage and is determined according to whether the memory block passes or fails the sub-erase verifications.

In some embodiments, the memory block is determined to pass or fail an ultimate erase verification by using the erase verification voltage after the memory blocked is erased by applying the second erase voltage.

In some embodiments, the memory block fails the initial erase verification when threshold voltages of a predetermined number of memory cells in the memory block are higher than the initial erase verification voltage; and the memory block fails the ultimate erase verification when the threshold voltages of the predetermined number of memory cells are higher than the erase verification voltage.

In some embodiments, the initial erase verification voltage or the erase verification voltage is applied to the plurality of word lines coupled to the plurality of memory cells.

In some embodiments, the erase and erase verification for the memory device is completed when the memory block passes the ultimate erase verification.

In some embodiments, the sub-erase verifications comprise M number of sub-erase verification operations and the sub-erase verification voltages comprise M number of sub-erase verification voltages, where M is a first whole number not smaller than 1 and a first sub-erase verification voltage is the initial erase verification voltage subtracting a half of the first erase step voltage.

In some embodiments, an ith sub-erase verification voltage is an (i−1)th sub-erase verification voltage subtracting a first product of $$\frac{1}{2^i}$$

and the first erase step voltage when the memory block passes an (i−1)th sub-erase verification; and the ith sub-erase verification voltage is the (i−1)th sub-erase verification voltage adding the first product of $$\frac{1}{2^i}$$

and the first erase step voltage when the memory block fails the (i−1)th sub-erase verification, where i is a second whole number larger than 1 but not larger than M.

In some embodiments, the second erase step voltage is an Mth sub-erase verification voltage subtracting the erase verification voltage when the memory block passes an Mth sub-erase verification; and the second erase step voltage is the Mth sub-erase verification voltage subtracting the erase verification voltage and adding a second product of $$\frac{1}{2^M}$$

and the first erase step voltage when the memory block fails the Mth sub-erase verification.

In some embodiments, the memory block fails the (m−1)th sub-erase verification when threshold voltages of a predetermined number of memory cells in the memory block are higher than the (m−1)th sub-erase verification voltage.

Yet another aspect of the present disclosure provides a memory system. The memory system includes a memory controller and a NAND flash memory managed by the memory controller. The NAND flash memory includes a memory block having a plurality of memory cells and a plurality of word lines and bit lines, where each memory cell is coupled to a word line and a bit line. The NAND flash memory also includes a control circuit configured to send control signals for performing erase and erase verification operations for the memory block. The control signals, when executed, cause the NAND flash memory to apply a first erase voltage to erase the memory block, where the first erase voltage is incrementally increased by a first erase step voltage until the memory block passes an initial erase verification using an initial erase verification voltage that is higher than an erase verification voltage by the first erase step voltage. The control signals, when executed, also cause the NAND flash memory to determine whether the memory block passes or fails sub-erase verifications by applying sub-erase verification voltages after the memory block passes the initial erase verification. The sub-erase verification voltages are in a range between the erase verification voltage and the initial erase verification voltage. The control signals, when executed, further cause the NAND flash memory to apply a second erase voltage to erase the memory block after the sub-erase verifications, where the second erase voltage is increased from the first erase voltage by a second erase step voltage. The second erase step voltage is smaller than the first erase step voltage and is determined according to whether the memory block passes or fails the sub-erase verifications.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 5(a)-5(d) illustrate erase states different memory blocks, according to some embodiments of the present disclosure.

FIGS. 7(a)-7(c) illustrate examples of erase and erase verification for different memory blocks, according to some embodiments of the present disclosure.

Figure 1A:
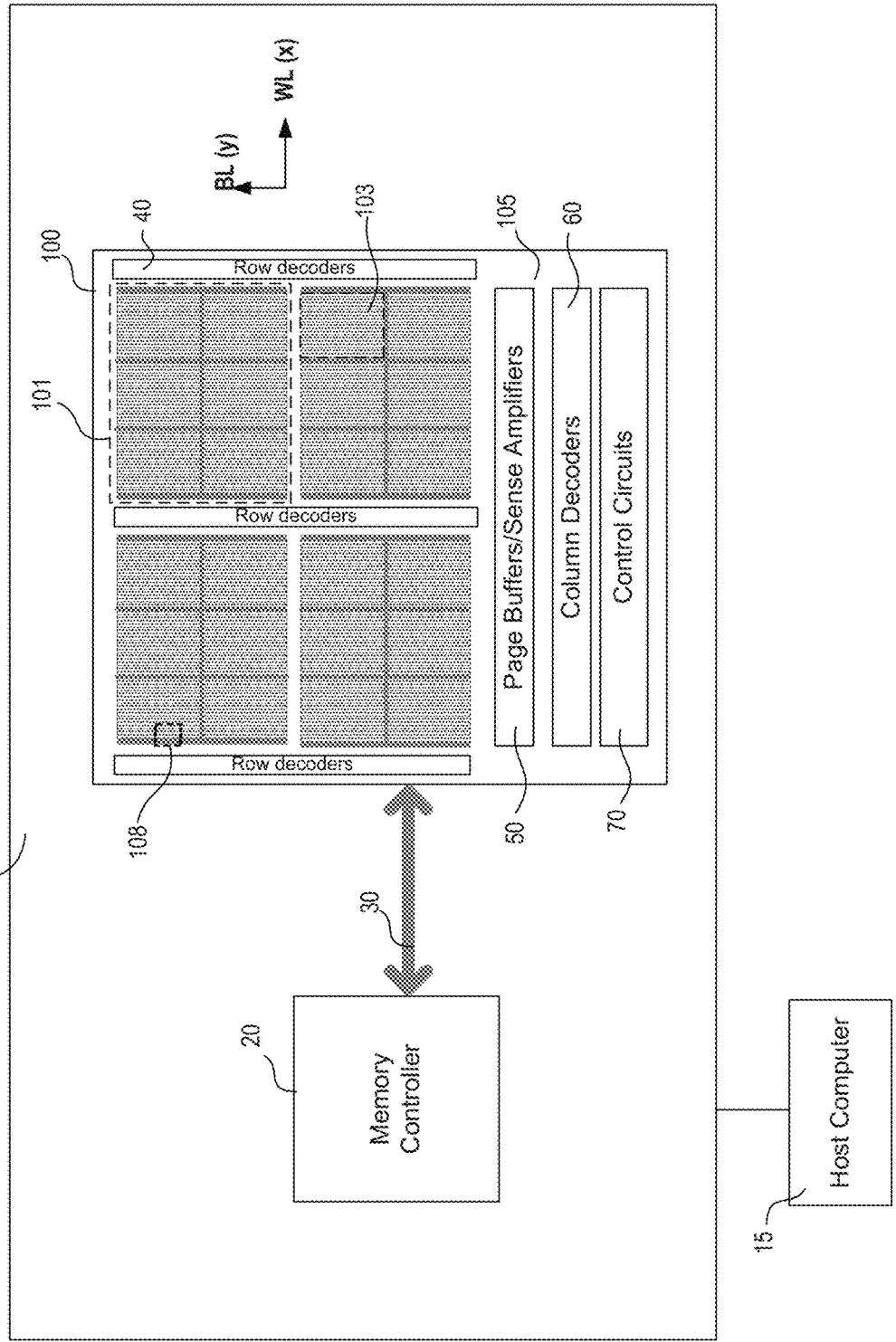
FIGS. 1A-1C illustrate a storage system with a NAND flash memory, according to some embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1A illustrates a block diagram of an exemplary system S1 having a storage system 10, according to some embodiments of the present disclosure. System S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) includes a NAND flash memory 100 and a memory controller 20. The storage system 10 can communicate with a host computer 15 through the memory controller 20, where the memory controller 20 can be connected to the NAND flash memory 100 via a memory channel 30. In some embodiments, the storage system 10 can have more than one NAND flash memory 100, while each NAND flash memory 100 can be managed by the memory controller 20.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the NAND flash memory 100. The memory channel 30 can provide data and control communication between the memory controller 20 and the NAND flash memory 100 via a data bus.

Figure 1B:
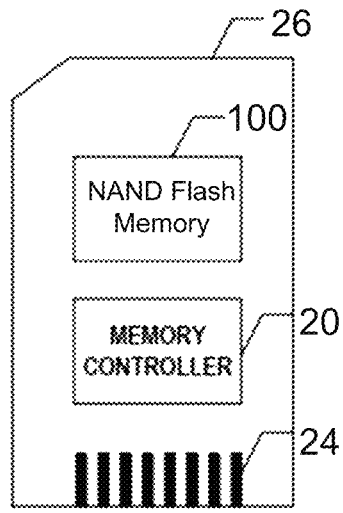
Figure 1C:
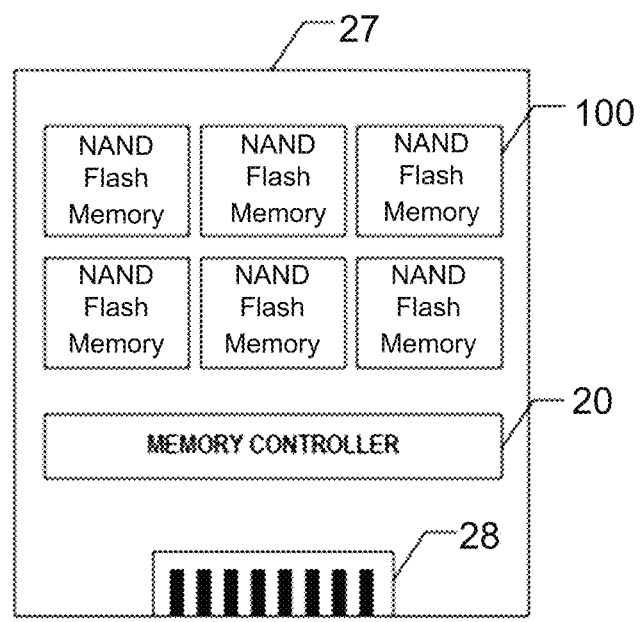

Memory controller 20 and one or more NAND flash memory 100 can be integrated into various types of storage devices, for example, be included in the same package, such as a universal Flash storage (UFS) package or an eMMC package. That is, storage system 10 can be implemented and packaged into different types of end electronic products. In one example as shown in FIG. 1B, memory controller 20 and a single NAND flash memory 100 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 1A). In another example as shown in FIG. 1C, memory controller 20 and multiple NAND flash memories 100 can be integrated into an solid state drive (SSD) 27. SSD 27 can further include an SSD connector 28 coupling SSD 27 with a host (e.g., the host computer 15 in FIG. 1A).

Referring to FIG. 1A, the NAND flash memory 100 (i.e., "flash," "NAND flash" or "NAND") can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1A, the exemplary NAND flash memory 100 includes four memory planes 101 and each memory plane 101 includes six memory blocks 103.

Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1A. In this disclosure, the memory block 103 is also referred to as the "memory array" or "array." The memory array is the core area in a memory device, performing storage functions.

The NAND flash memory 100 also includes a periphery region 105, an area surrounding memory planes 101. The periphery region 105 contains many digital, analog, and/or mixed-signal circuits to support functions of the memory array, for example, page buffers/sense amplifiers 50, row decoders 40, column decoders 60, and control circuits 70. Control circuits 70 include active and/or passive semiconductor devices, such as transistors, diodes, capacitors, resistors, etc., as would be apparent to a person of ordinary skill in the art.

It is noted that the layout of the electronic components in the storage system 10 and the NAND flash memory 100 in FIG. 1A are shown as an example. The storage system 10 and the NAND flash memory 100 can have other layout and can include additional components. For example, The NAND flash memory 100 can also have high-voltage charge pumps, I/O circuits, etc. The storage system 10 can also include firmware, data scrambler, etc.

Figure 2A:
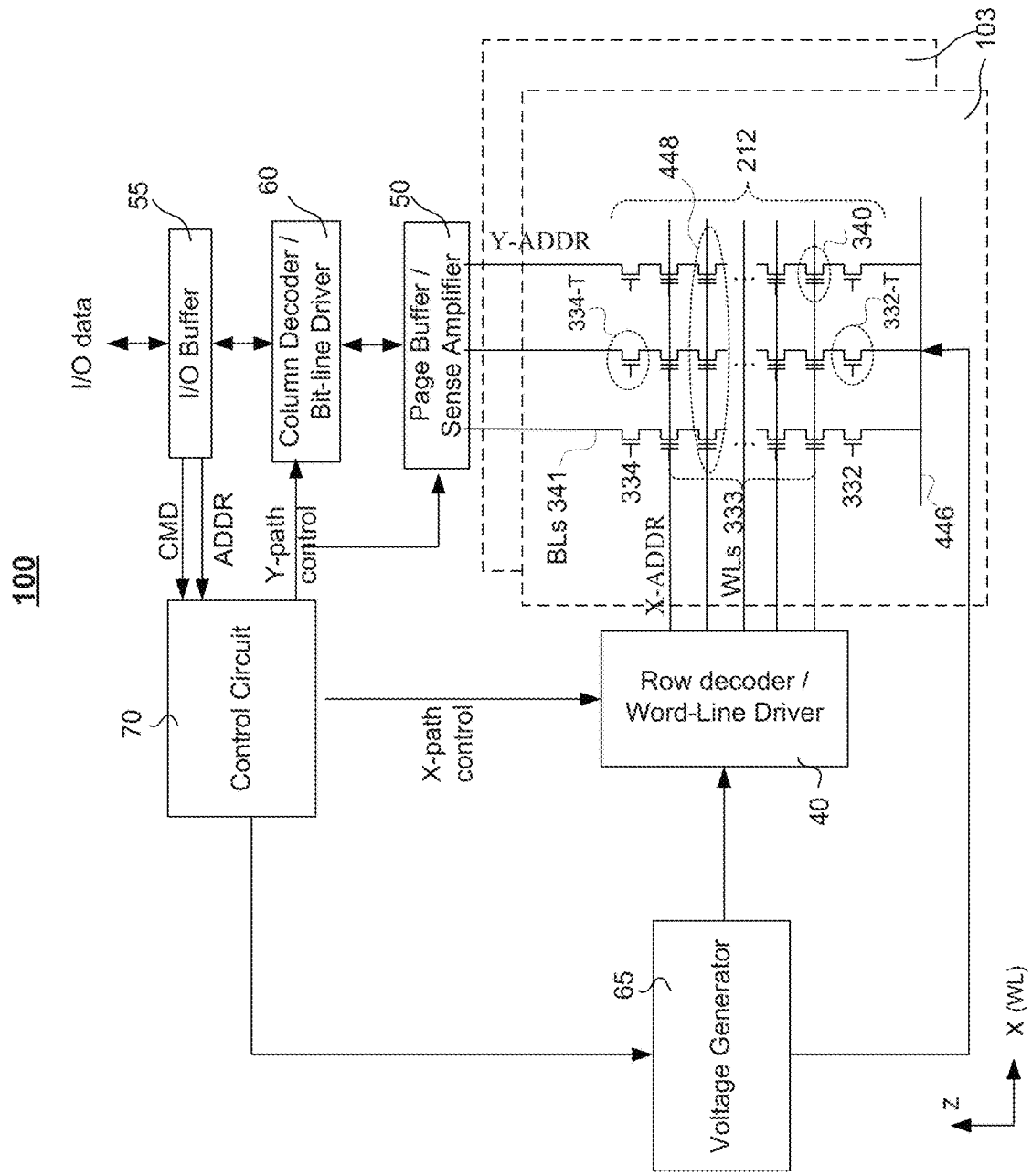
FIG. 2A shows a schematic circuit diagram of a NAND flash memory, according to some embodiments of the present disclosure.

FIG. 2A shows a schematic diagram of the NAND flash memory 100, according to some embodiments of the present disclosure. The NAND flash memory 100 includes one or more memory blocks 103. Each memory block 103 includes memory strings 212. Each memory string 212 includes memory cells 340. The memory cells 340 sharing the same word line forms a memory page 448. The memory string 212 can also include at least one field effect transistor (e.g., MOSFET) at each end, which is controlled by a bottom select gate (BSG) 332 and a top select gate (TSG) 334, respectively. The drain terminal of a top select transistor 334-T can be connected to the bit line 341, and the source terminal of a bottom select transistor 332-T can be connected to an array common source (ACS) 446. The ACS 446 can be shared by the memory strings 212 in an entire memory block, and is also referred to as the common source line.

The NAND flash memory 100 can also include a periphery circuit that includes many digital, analog, and/or mixed-signal circuits to support functions of the memory block 103, for example, a page buffer/sense amplifier 50, a row decoder/word line driver 40, a column decoder/bit line driver 60, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, bottom select gates ("BSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the NAND flash memory 100 in response to a X-path control signal provided by the control circuit 70. The row decoder/word line driver 40 can transfer voltages provided from the voltage generator 65 to the word lines according to the X-path control signal. During a read and programming operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70. During an erase operation, the row decoder/word line driver 40 can apply a zero voltage to the selected word line and apply an erase voltage $V_{erase}$ to the ACS 446.

The column decoder/bit line driver 60 can transfer an inhibit voltage $V_{inhibit}$ to an unselected bit line and connect a selected bit line to ground according to a Y-path control signal received from the control circuit 70. In the other words, the column decoder/bit line driver 60 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 448. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1A) and the NAND flash memory 100.

The control circuit 70 can send control signals to control the page buffer/sense amplifier 50, the column decoder/bitline driver 60, the row decoder/word line driver 40 and the voltage generator 65 in response to the commands CMD transferred by the input/output buffer 55. During the programming operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. During the erase operation, the control circuit 70 can control the row decoder/word line driver 40 and the column decoder/bit-line driver 60 to erase a selected memory block. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify the memory page 448, memory block 103, and memory plane 101 (in FIG. 1A), respectively. The column address Y-ADDR can identify a byte or a word in the data of the memory page 448.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, the erase voltage $V_{erase}$, etc.

It is noted that the schematic diagram shown in FIG. 2A is only an example. Circuit components shown in FIG. 2A can be laid out differently. The NAND flash memory 100 can also include additional components.

In some embodiments, the NAND flash memory 100 can be formed based on the floating gate technology. In some embodiments, the NAND flash memory 100 can be formed based on charge trapping technology. The NAND flash memory based on charge trapping can provide high storage density and high intrinsic reliability. Storage data or logic states (e.g., threshold voltage $V_{th}$ of the memory cell 340) depends on the amount of charge trapped in a storage layer.

Figure 2B:
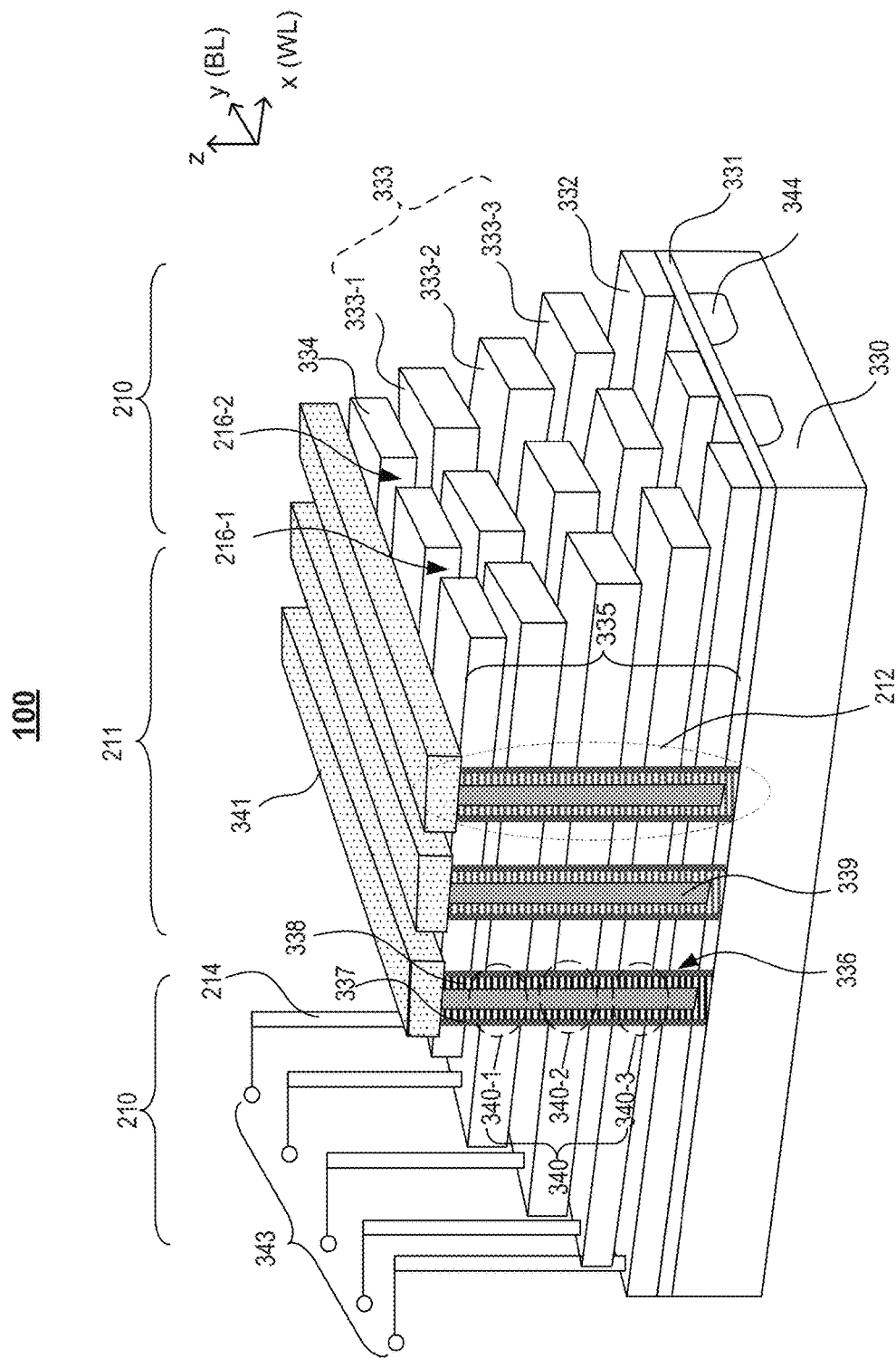
FIG. 2B illustrates a perspective view of a three-dimensional NAND flash memory, in accordance with some embodiments of the present disclosure.

In some embodiments, the NAND flash memory 100 can be a three-dimensional (3D) NAND flash memory, where the memory cells 340 can be vertically stacked on top of each other. FIG. 2B illustrates a perspective view of a portion of an exemplary 3D NAND flash memory, according to some embodiments of the present disclosure. The 3D NAND flash memory includes a substrate 330, an insulating film 331 over the substrate 330, a tier of bottom select gates (BSGs) 332 over the insulating film 331, and tiers of control gates 333, also referred to as "word lines (WLs)," stacking on top of the BSGs 332 to form a film stack 335 of alternating conductive and dielectric layers. The dielectric layers adjacent to the tiers of control gates are not shown in FIG. 2B for clarity.

The control gates of each tier are separated by slit structures 216-1 and 216-2 through the film stack 335. The 3D NAND flash memory also includes a tier of top select gates (TSGs) 334 over the stack of control gates 333. The stack of TSG 334, control gates 333 and BSG 332 is also referred to as "gate electrodes". The 3D NAND flash memory further includes memory strings 212 and doped source line regions 344 in portions of substrate 330 between adjacent BSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filler 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the memory cell. The 3D NAND flash memory further includes bit lines (BLs) 341 connected with the memory strings 212 over the TSGs 334. 3D NAND flash memory also includes metal interconnect lines 343 connected with the gate electrodes through contact structures 214. The edge of the film stack 335 is configured in a shape of staircase to allow an electrical connection to each tier of the gate electrodes.

In FIG. 2B, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The 3D NAND flash memory can also include other structures, for example, TSG cut, common source contact, array common source and dummy memory string. These structures are not shown in FIG. 2B for simplicity.

Although the NAND flash memory 100 in FIG. 1A can be the 3D NAND flash memory described in FIG. 2B, the NAND flash memory 100 is not so limited in the represent disclosure and can have any suitable structures.

In a NAND flash memory, read and programming operations can be performed in a memory page 448, which includes all memory cells 340 sharing the same word line. In a NAND memory, the memory cell 340 can be in an erase state ER or a programmed state P1. Initially, all memory cells 340 in the memory array 103 can be reset to the erase state ER as logic "1" by implementing a negative voltage difference between the control gates 333 and source terminals of the memory cells (e.g., the array common source 446) such that all the trapped electronic charges in the storage layer of the memory cells 340 can be removed. For example, the negative voltage difference can be induced by setting the control gates 333 of the memory cells 340 to ground, and applying a high positive voltage to the array common source 446. At the erase state ER ("state ER"), the threshold voltage $V_{th}$ of the memory cells 340 can be reset to the lowest value, and can be measured or sensed at the bit line 341.

During programming (i.e., writing), a programming voltage $V_{pgm}$ (e.g., a positive voltage pulse between 10 V and 20 V) can be applied on the control gate 333 such that electronic charges (e.g., electrons) can be injected into the storage layer of the memory cell 340, and thereby increase the threshold voltage $V_{th}$ of the memory cell 340. Thus, the memory cell 340 is programmed to the state P1.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states (i.e., state ER and states P1-P15). To summarize, a memory cell in an xLC mode can be programmed to $2^n$ states and can store n-bit of data, where n is a whole number. For example, n equals 1, 2, 3, and 4 for SLC, MLC, TLC and QLC mode, respectively.

Figure 3:
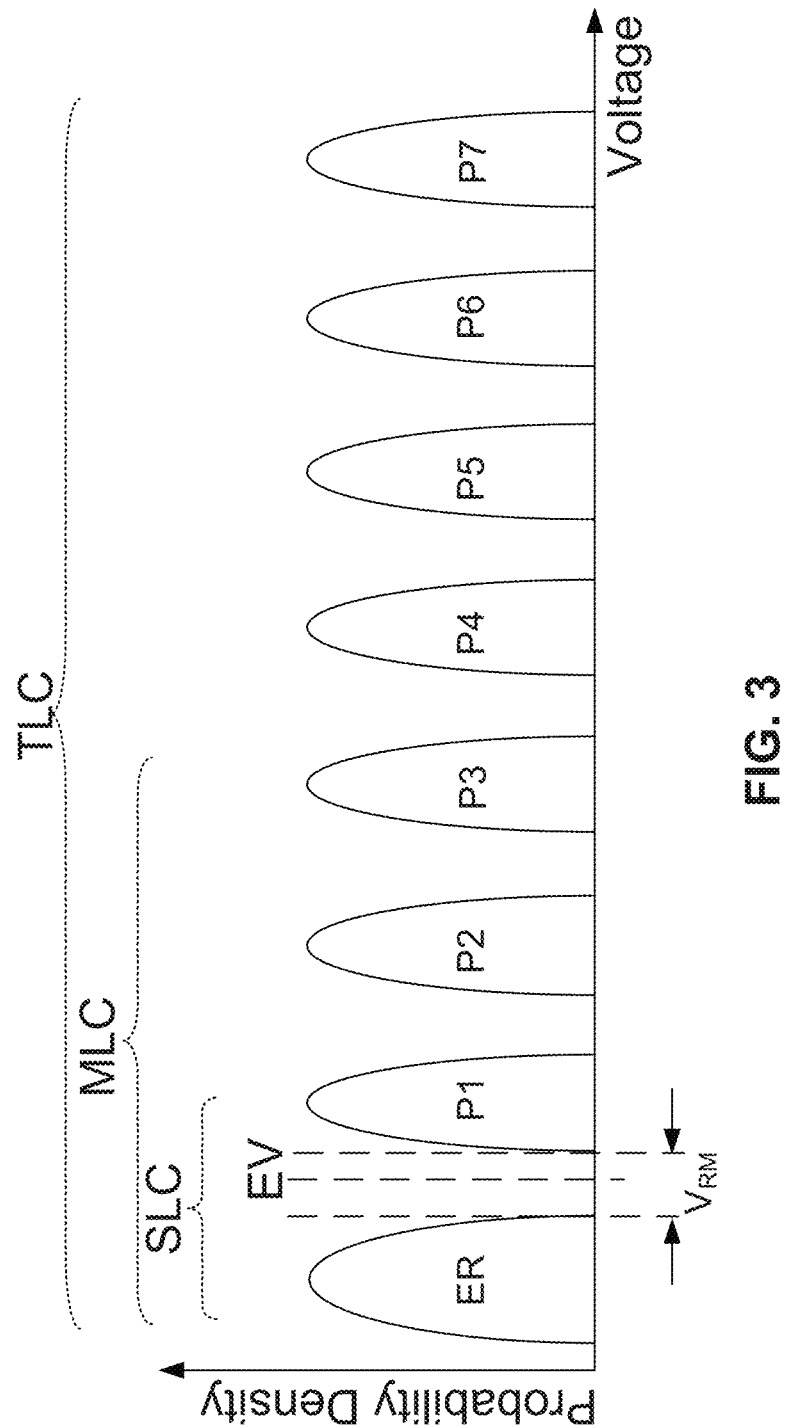
FIG. 3 illustrates a threshold voltage $V_{th}$ distribution of a NAND flash memory, according to some embodiments of the present disclosure.

FIG. 3 illustrates a threshold voltage $V_{th}$ distribution of a NAND flash memory programmed in the xLC mode, according to some embodiments of the present disclosure. Due to various variations, each state of the memory cells includes a range of threshold voltages $V_{th}$, where the threshold voltage $V_{th}$ distribution of each state can be represented by a probability density. In some embodiments, each state of the xLC mode (SLC, MLC, TLC, QLC, etc.) can be programmed by using an incremental step pulse programming (ISPP) scheme where the programming voltage $V_{pgm}$ can be incrementally increased by adding a programming step pulse $V_{step\_prg}$. For example, the eight TLC states can be programmed from the state EP to the state P1 with a lower threshold voltage first, and then to the state P7 with a highest threshold voltage. Likewise, sixteen QLC states (not shown in FIG. 3) can be programmed from the state P1 to the state P15, where the state P15 has a highest threshold voltage. In the xLC mode, the $2^n$ states can be programmed from the state EP to the state P1, P2, . . . P($2^n$–1) sequentially, where from the state P1 to the state P($2^n$–1), threshold voltage of the memory cell increases.

Figure 4:
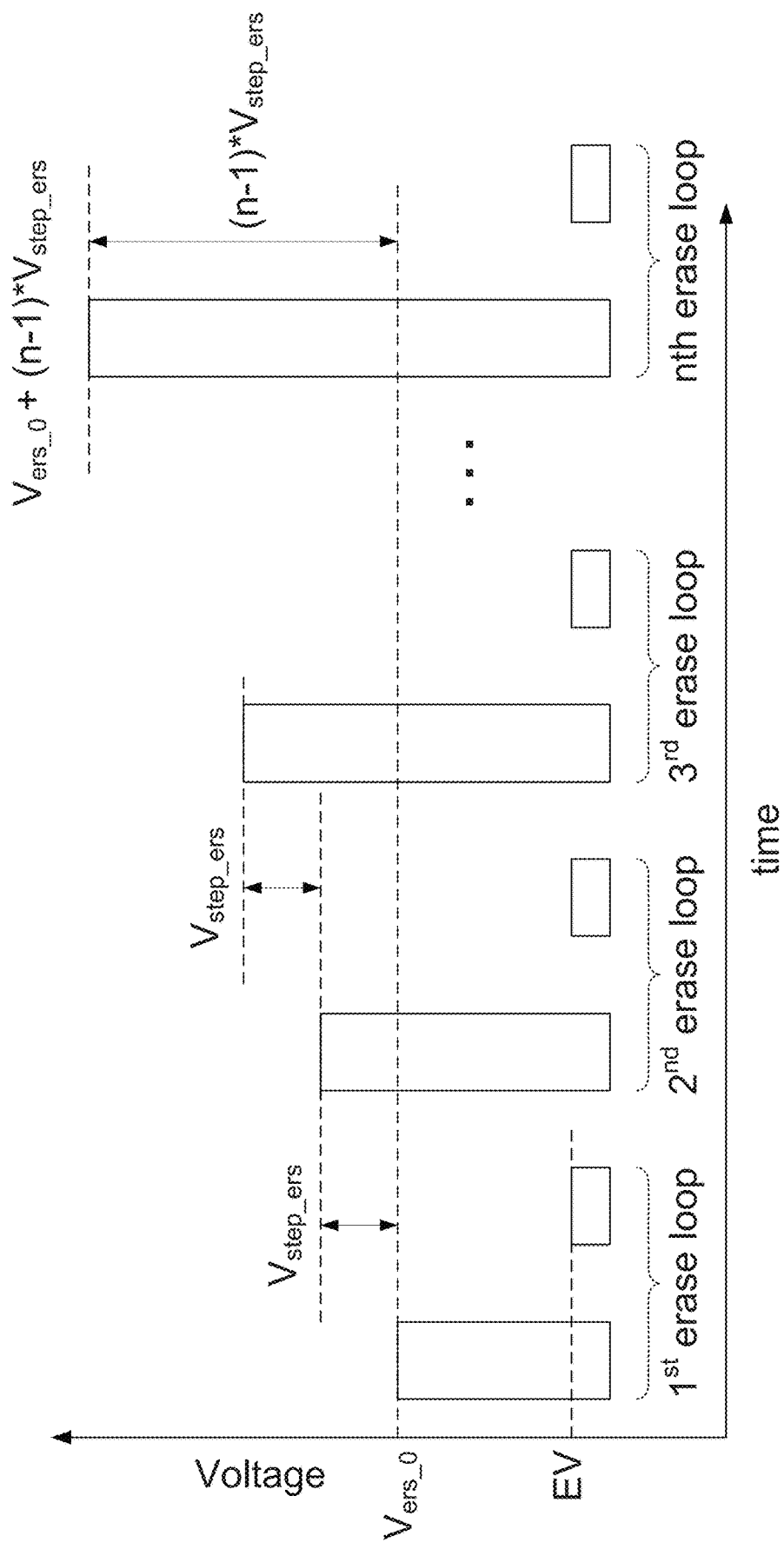
FIG. 4 illustrates an incremental step pulse erase (ISPE) scheme, according to some embodiments of the present disclosure.

FIG. 4 illustrates an incremental step pulse erase (ISPE) scheme to perform erase and erase verification operations on the memory cells in a memory block, according to some embodiments of the present disclosure. In this example, the memory cells can implement the xLC mode and each can have $2^n$ states. The ISPE scheme starts with a first erase loop including an erase operation and an erase verification operation. During the erase operation, a pulse with an initial erase voltage $V_{ers\_0}$ can be applied to all the memory cells in a memory block (e.g., the memory block 103 in FIG. 1A) to reset the memory cells to the state ER. During the erase verification operation, another pulse with an erase verification voltage EV can be applied to the memory cells to determine whether the memory cells are in the state ER. The initial erase voltage $V_{ers\_0}$ can be in a range between 15 V to 23 V, and the erase verification voltage EV can be in a range between −3 V to 2 V. In some embodiments, the initial erase voltage $V_{erase}$ can be 17 V, and the erase verification voltage EV can be 0.5V.

To determine if the memory cells are at the state ER, or if the erase operation is completed successfully, the erase verification voltage EV can be applied to the word lines of the memory cells. If the erase verification voltage EV is higher than the threshold voltage of the memory cell (see FIG. 3), it can be determined that the memory cell is at the state ER. If all the memory cells in the memory block are at the state ER, it is considered that the memory block passes the erase verification operation (or erase verification). If some of the memory cells are not at the state ER, a second erase loop can be implemented.

The erase verification operation is similar to the read operation. If the erase verification voltage EV applied to the word line is higher than the threshold voltage of the memory cell, the memory cell is switched on. If the erase verification voltage EV applied to the word line is lower than the threshold voltage of the memory cell, the memory cell is switched off. By sensing the current flowing through the memory cell, the erase verification voltage EV applied on the word line can be compared with the threshold voltage of the memory cell. Whether the memory cell is reset to the state ER can thereby be determined.

In the second erase loop, an erase step voltage $V_{step\_ers}$ can be added to the initial erase voltage $V_{ers\_0}$ during the erase operation and the erase verification operation can be performed afterwards. In the other words, the memory cells can be erased by a pulse having a higher voltage. The erase voltage $V_{erase}$ in the second erase loop can be expressed as $V_{erase}=V_{ers\_0}+V_{step\_ers}$. In each subsequent erase loop, the erase voltage $V_{erase}$ is increased incrementally with the erase step voltage $V_{step\_ers}$. In a final erase loop (or an nth erase loop), the erase voltage $V_{erase}$ can be increased by a voltage of $(n-1)*V_{step\_ers}$ and can be expressed as $V_{erase}=V_{ers\_0}+(n-1)*V_{step\_ers}$, where n is a whole number, representing a number of erase loops used in the ISPE scheme. In some embodiments, the erase step voltage $V_{step\_ers}$ can be in a range between 0.1 V to 1.2 V.

During the erase operation, the erase voltage $V_{erase}$ can be applied to an n-well in the substrate that is shared by all the memory cells in the same memory block in order to increase the storage density. In some embodiments, the erase voltage $V_{erase}$ can be applied to the ACS 446 as shown in FIG. 2A. In some embodiments, the NAND flash memory 100 can have a three-dimensional structure as shown in FIG. 2B. In this example, the NAND flash memory can also include an additional transistor at each end of the memory string to facilitate the erase operation, where the additional transistor introduces gate-induced drain leakage (GIDL).

To simplify description, in the present disclosure, the memory block is considered to pass the erase verification when all the memory cells in the memory block are at the state ER, i.e., having threshold voltages lower than or equal to the erase verification voltage EV. However, other criteria can also be used. If it is verified that all the memory cells in the memory block have been reset to the state ER, the erase and erase verification operations can be stopped, e.g., after the nth erase loop. In some embodiments, the erase and erase verification operations can also be terminated when a predetermined condition is met, for example, a maximum number of erase loops has been reached, or the number of memory cells that are not reset to the state ER is below a predetermined number.

By using the ISPE scheme in FIG. 4, the memory cells programmed to the states P1, P2, P3, . . . , P($2^n$−1) as in the xLC mode can be reset to the state ER. However, there are some issues associated with the traditional ISPE scheme. First, during each erase operation, all the memory cells in the same memory block are applied with the erase voltage $V_{erase}$, even those memory cells that have been reset to the state ER. The erase and erase verification operations will be repeated until all the memory cells in the same memory block are reset to the state ER, or the predetermined condition is met. After cycles of erasing, memory films of the memory cells can deteriorate due to the amount of Flower-Nordheim (F-N) current that flows through the memory film. Cycle defects can be generated in the memory films such that it takes longer to reset the memory cells to the state ER. Therefore, erase speed of the memory cells can be reduced. Second, by applying the same erase voltage $V_{erase}$ and the same erase step voltage $V_{step\_ers}$, different memory blocks can be reset to the state ER with various proximity to the erase verification voltage EV due to variation of the erase speed.

FIGS. 5(a) and (b) illustrate a second erase state ER2 of a second memory block, and FIGS. 5(c) and (d) illustrate a first erase state ER1 of a first memory block, according to some embodiments of the present disclosure. The second memory block has an erase speed faster than the first memory block. As shown in FIG. 5(a), after a second to final erase loop (i.e., an (n−1)th erase loop), most of the memory cells in the second memory block have threshold voltages lower than the erase verification voltage EV. Only a few memory cells fail the erase verification because the threshold voltages of these memory cells are higher than the erase verification voltage EV. As shown in FIG. 5(c), after the (n−1)th erase loop, most of the memory cells in the first memory block have threshold voltages higher than the erase verification voltage EV. Only a few memory cells pass the erase verification. The first memory block in FIG. 5(c) has a slower erase speed than the second memory block in FIG. 5(a).

During the final erase loop (i.e., the nth erase loop), the memory cells in the first and second memory blocks are applied with the erase voltage $V_{erase}(n)$, where $V_{erase}(n)=V_{erase}(n-1)+V_{step\_ers}$, where the erase voltage $V_{erase}(n-1)$ was used in the (n−1)th erase loop. After the nth erase loop, shown in FIGS. 5(b) and 5(d), those memory cells that fail erase verification during the (n−1)th erase loop can now be reset to the second erase state ER2 and the first erase state ER1, respectively. The threshold voltages of the memory cells in the first and second memory blocks are all now below the erase verification voltage EV. However, the second erase state ER2 are farther away from the erase verification voltage EV. The second memory block is considered to be erased "deep." A deepest erase can take place when a high edge of the second erase state ER2 equals the erase verification voltage EV subtracting the erase step voltage $V_{step\_ers}$. On the other hand, as shown in FIG. 5(d), the first erase state ER1 of the first memory block is closer to the erase verification voltage EV. The first memory block is considered to be erased "shallow." In some embodiments, a shallowest erase can take place when a high edge of the first erase state ER1 equals the erase verification voltage EV.

As illustrated in FIGS. 5(a)-(d), using the ISPE scheme in FIG. 4, an variation range of the erase state ER (i.e., an erase depth) can be the erase step voltage $V_{step\_ers}$. Because the erase step voltage $V_{step\_ers}$ is predetermined, a memory block can be erased too deep or too shallow. A deep erase memory block can result in degraded endurance, and a shallow erase memory block can have a reduced read margin. Therefore, it is desired to improve the ISPE scheme such that the erase voltage $V_{erase}(n)$ used in the final erase loop will reset the memory cells so that the state ER can be determined more precisely.

Figure 6:
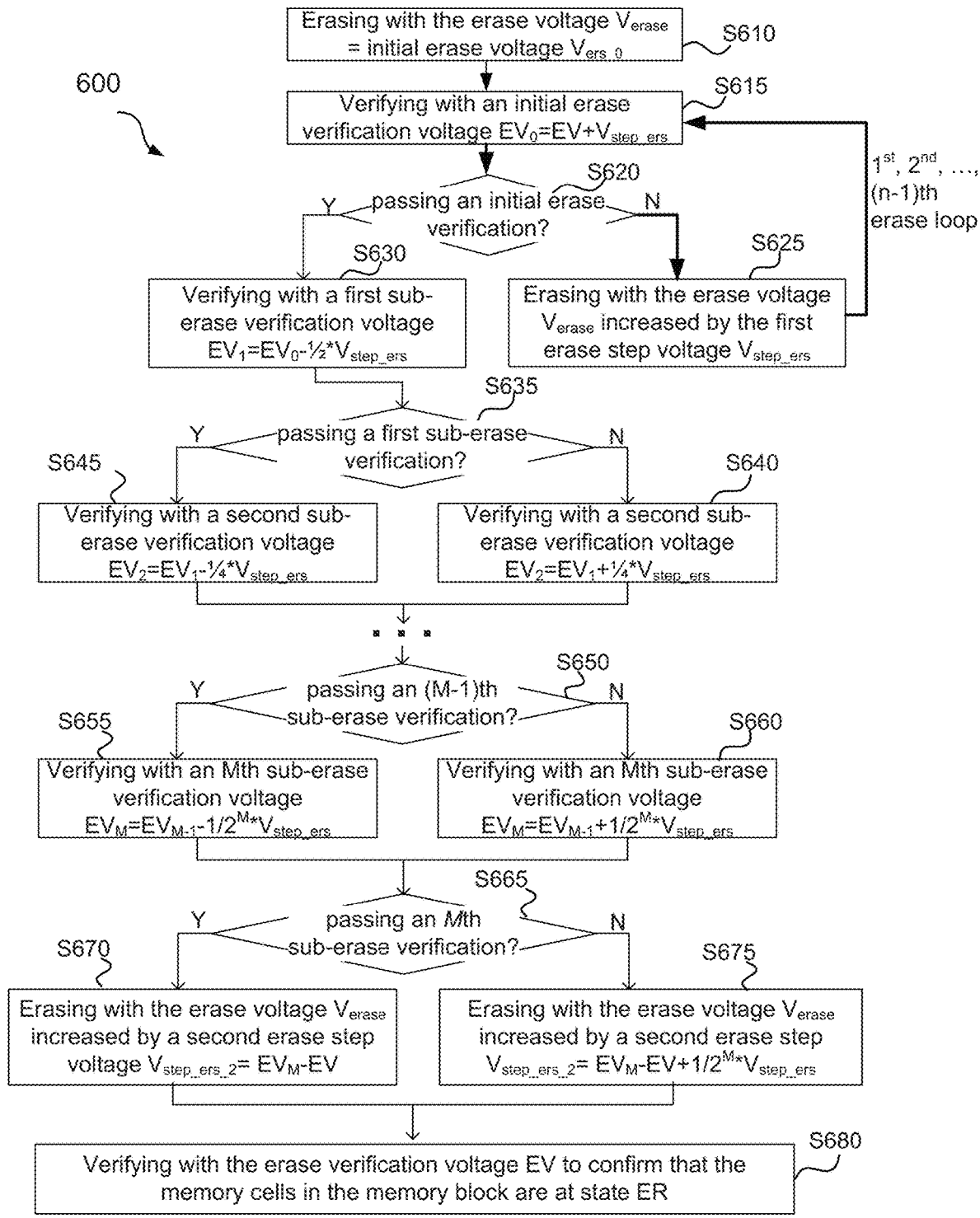
FIG. 6 illustrates a flow diagram of a method of erase and erase verification for a NAND flash memory, according to some embodiments of the present disclosure.

FIG. 6 illustrates a flow diagram of an erase and erase verification method 600 for a memory block in a NAND flash memory, according to some embodiments of the present disclosure. The memory block can be the memory block 103 shown in FIG. 1A. It should be understood that the method 600 are not exhaustive and that other operation steps can be performed as well before, after, or between any of the illustrated operation steps. In some embodiments, some operation steps of method 600 can be omitted or other operation steps can be included, which are not described here for simplicity. In some embodiments, operation steps of method 600 can be performed in a different order and/or vary.

The method 600 starts at operation step 610 with the first erase loop, where the initial erase voltage $V_{ers\_0}$ can be applied to all the memory cells in the memory block to perform a first erase operation. In the first erase loop, the erase voltage $V_{erase}(1)$ equals the initial erase voltage $V_{ers\_0}$, i.e., $V_{erase}=V_{ers\_0}$.

As described previously, the erase voltage $V_{erase}$ can be applied to an n-well in the substrate of a NAND flash memory, or the ACS 446 as shown in FIG. 2A. All the erase operations described in the method 600 can also be supported with the additional transistor at each end of the memory string to facilitate the erase operations through gate-induced drain leakage (GIDL). In one example, the word lines of the memory cells can be grounded during the erase operations.

At operation step S615, an initial erase verification voltage $EV_0$ can be used during a first erase verification operation. The initial erase verification voltage $EV_0$ is a sum of the erase verification voltage EV and the erase step voltage $V_{step\_ers}$ (also referred to as a first erase step voltage), i.e., $EV_0=EV+V_{step\_ers}$. As described previously with respect to FIG. 3, the erase verification voltage EV can have a magnitude higher than the state ER and lower than the state P1. The erase verification voltage EV can be used to determine if the memory cell is at the state ER. If the threshold voltage of the memory cell is lower than or equal to the erase verification voltage EV, the memory cell is considered to be at the state ER.

During the first erase loop, the initial erase verification voltage $EV_0$ can be applied to the word lines of the memory cells and can be used to compare with the threshold voltages of the memory cells. If the threshold voltage of any memory cell in the memory block is higher than the initial erase verification voltage $EV_0$, the memory block can be considered to have failed an initial erase verification. If the threshold voltages of all the memory cells in the memory block are equal to or lower than the initial erase verification voltage $EV_0$, the memory block can be considered to have passed the initial erase verification.

It is noted that criteria to determine whether the memory block passes an erase verification (e.g., the initial erase verification at operation step S620) does not necessary depend on whether all the memory cells in the memory block pass the erase verification. The criteria can be modified. For example, the memory block can be considered "passed" if the number of memory cells that fail the erase verification is below a predetermined value. For example, the memory block can be considered as having passed the initial erase verification if threshold voltages of a predetermined number of memory cells are higher than the initial erase verification voltage $EV_0$. The memory block can also be considered passing the erase verification if a maximum number of erase loops has been reached.

At operation step S620, a determination is made whether the memory block passes or fails the initial erase verification using the initial erase verification voltage $EV_0$. If the memory block fails the initial erase verification at operation step S620, the method 600 proceeds to operation step S625 to start a second erase loop.

At operation step S625, the erase voltage $V_{erase}$ can be increased by the first erase step voltage $V_{step\_ers}$, i.e., adding the first erase step voltage $V_{step\_ers}$ to a previous erase voltage $V_{erase}$ used in a previous erase loop. For the second erase loop, the first erase step voltage $V_{step\_ers}$ is added to the initial erase voltage $V_{ers\_0}$ such that the erase voltage $V_{erase}=V_{ers\_0}+V_{step\_ers}$. Next, the operation steps S615 and S620 can be repeated to perform a second erase verification (i.e., anther initial erase verification) for the second erase loop. As such, the first erase loop, the second erase loop, . . . , the (n−1)th erase loop can be performed by repeating the operation steps S615, S620 and S625 until the memory block passes the initial erase verification at the operation step S620 for the (n−1)th erase loop (i.e., the last to final erase loop). By repeating the operation steps S615, S620 and S625, the memory block is erased in a similar way as the ISPE scheme described previously with respect to FIG. 4, where the erase voltage $V_{erase}(i)=V_{erase}(i-1)+V_{step\_ers}$, where i is a whole number, representing an ith erase loop. However, the threshold voltages of the memory cells are compared with the initial erase verification voltage $EV_0=EV+V_{step\_ers}$, instead of the erase verification voltage EV, in the first, second, . . . , (n−1)th erase loops.

When the memory block passes the (n−1)th erase verification at operation step S620 during the (n−1)th erase loop, additional erase verification operations can be performed. Through additional erase verifications (e.g., at operation steps S630-S665), a second erase step voltage $V_{step\_ers\_2}$, having a magnitude smaller than the first erase step voltage $V_{step\_ers}$, can be determined for a final erase operation during the final erase loop (i.e., the nth erase loop). By applying the erase voltage $V_{erase}(n)$ with a suitable amount for the final erase loop, the memory cells can be reset to state ER, avoiding a deep erase or shallow erase.

At operation step S630, a first sub-erase verification voltage $EV_1$ can be used to compare with the threshold voltages of the memory cells. In some embodiments, the first sub-erase verification voltage $EV_1$ can be the initial erase verification voltage $EV_0$ subtract a half of the first erase step voltage $V_{step\_ers}$, i.e., $$EV_1 = EV_0 - \frac{1}{2}V_{step\_ers}.$$

In the other words, the first sub-erase verification voltage $EV_1$ can be located between the erase verification voltage EV and the initial erase verification voltage $EV_0$, for example, at a middle point. The first sub-erase verification voltage $EV_1$ can also be expressed as an average between the erase verification voltage EV and the initial erase verification voltage $EV_0$, i.e., $$EV_1 = \frac{1}{2}(EV + EV_0).$$

At operation step S635, a determination is made whether the threshold voltages of the memory cells are higher than the first sub-erase verification voltage $EV_1$ or not. The memory block can be considered to have "failed" a first sub-erase verification if the threshold voltage of any memory cell in the memory block is higher than the first sub-erase verification voltage $EV_1$, and the method 600 proceeds to operation step S640. The memory block can be considered to have "passed" the first sub-erase verification if the threshold voltages of all the memory cells are lower than or equal to the first sub-erase verification voltage $EV_1$, and the method 600 proceeds to operation step S645.

If the memory block fails the first sub-erase verification, a second sub-erase verification voltage $EV_2$ can be used to compare with the threshold voltages of the memory cells at operation step S640, where $$EV_2 = EV_1 - \frac{1}{4}V_{step\_ers}.$$

The second sub-erase verification voltage $EV_2$ can also be expressed as an average between the initial erase verification voltage $EV_0$ and the first sub-erase verification voltage $EV_1$. The second sub-erase verification voltage $EV_2$ can be a middle point located between the initial erase verification voltage $EV_0$ and the first sub-erase verification voltage $EV_1$.

If the memory block passes the first sub-erase verification, the second sub-erase verification voltage $EV_2$ can be selected as an average between the erase verification voltage EV and the first sub-erase verification voltage $EV_1$ at operation step S645, namely, $$EV_2 = EV_1 - \frac{1}{4}V_{step\_ers}.$$

The threshold voltages of the memory cells can then be compared with the second sub-erase verification voltage $$EV_2 = EV_1 - \frac{1}{4}V_{step\_ers}.$$

In other words, the second sub-erase verification voltage $$EV_2 = EV_1 \pm \frac{1}{4}V_{step\_ers},$$

where a "+" sign can be selected if the memory block fails the first sub-erase verification, and a "−" sign can be selected if the memory block passes the first sub-erase verification.

A $3^{rd}$, $4^{th}$, . . . , (M−1)th, Mth sub-erase verification voltages can be determined similarly as the operation steps S635-S645. M is a whole number, representing a maximum number of sub-erase verifications. In some embodiments, M is predetermined, e.g., M=5.

Depending on whether the memory block passes or fails at the (M−1)th sub-erase verification at operation step S650, the Mth sub-erase verification voltage $EV_M$ can be expressed as $$EV_M = EV_{M-1} \pm \frac{1}{2^M}V_{step\_ers},$$

where the "+" sign can be selected if the memory block fails the (M−1)th sub-erase verification (see operation step S655), and the "−" sign can be selected if the memory block passes the (M−1)th sub-erase verification (see operation step S660).

After the Mth sub-erase verification voltage $EV_M$ is selected at the operation step S655 or S660, a determination is made whether the memory block fails or passes an Mth sub-erase verification at operation step S665. Similar to the first, second, . . . , (M−1)th sub-erase verifications, if the threshold voltages of all the memory cells are lower than or equal to the Mth sub-erase verification voltage $EV_M$, the memory block "passes" the Mth sub-erase verification. The method 600 proceeds to operation step S670, where a second erase step voltage $V_{step\_ers\_2}$ can be determined as $EV_M$−EV, i.e., $V_{step\_ers\_2}=EV_M$−EV. The erase voltage $V_{erase}(n)$ for the final erase loop, i.e., the nth erase loop, can be increased by the second erase step voltage $V_{step\_ers\_2}$.

If the threshold voltage of any memory cell is higher than the Mth sub-erase verification voltage $EV_M$, the memory block "fails" the Mth sub-erase verification. The second erase step voltage $V_{step\_ers\_2}$ can be determined as $$EV_M - EV + \frac{1}{2^M}V_{step\_ers},$$

as shown in operation step S675.

As a result, for the nth erase loop, the memory cells of the memory block can be reset to the state ER. This reset is done by applying the erase voltage $V_{erase}(n)=V_{erase}(n-1)+EV_M-$ EV if the memory block passes the Mth sub-erase verification at the operation step S665. Otherwise the erase voltage $$V_{erase}(n) = V_{erase}(n-1) + EV_M - EV + \frac{1}{2^M}V_{step\_ers}$$

can be applied if the memory block fails the sub-erase verification at the operation step S665.

At operation step S680, an ultimate erase verification can be performed to confirm that the memory cells are at the state ER. The erase verification voltage EV can be applied to the memory cells of the memory block. As shown in FIG. 3, threshold voltages of the memory cells at the state ER are lower than or equal to the erase verification voltage EV. In some embodiments, a read margin $V_{RM}$ between the state ER and the state P1, i.e., a distance from a lowest threshold voltage of the state P1 to a highest threshold voltage of the state ER, can be predetermined and can be used as a condition to determine the erase voltage $V_{erase}(n)$ in the final erase loop. The erase and erase verification method 600 for the memory block can be completed when the memory cells pass the ultimate erase verification using the erase verification voltage EV. If there are memory cells that fail the ultimate erase verification, the memory block or the corresponding memory cells can be marked as erase-fail.

It is noted that criteria used in the method 600 to determine whether the memory block passes an sub-erase verification (e.g., the $1^{st}$, $2^{nd}$, ..., Mth sub-erase verification) can depend on whether all the memory cells in the memory block pass the sub-erase verification, i.e., the threshold voltages of all the memory cells are lower than or equal to a sub-erase verification voltage (e.g., the $1^{st}$, $2^{nd}$, ..., Mth sub-erase verification voltages). However, other criteria can also be used. For example, the memory block can be considered to have passed the sub-erase verification if the number of memory cells that fail the sub-erase verification is below a predetermined value. In other words, the memory block can be considered to have passed the sub-erase verification if threshold voltages of a predetermined number of memory cells are higher than a corresponding sub-erase verification voltage.

FIG. 7(a) illustrates an exemplary threshold voltage distribution of a memory block, according to some embodiments of the present disclosure. At least one memory cell has threshold voltage that is higher than the initial erase verification voltage $EV_0$. In this example, the memory block can be considered to have failed the erase verification at the operation step S620.

FIGS. 7(b) and 7(c) illustrate exemplary implementations of the erase and erase verification method for a third memory block and a fourth memory block, respectively, according to some embodiments of the present disclosure. As an example, a maximum number of the sub-erase verifications M is selected as 3 for simplicity. When performing the $1^{st}$, $2^{nd}$, ..., (n−1)th erase loops through the operation steps S615-S625, the memory cells in the third and fourth memory blocks are erased with incrementally increased step pulses, i.e., the erase voltage $V_{erase}$ increased incrementally with the first erase step voltage $V_{step\_ers}$. The erase verifications can be performed by comparing the threshold voltages of the memory cells with the initial erase verification voltage $EV_0=EV+V_{step\_ers}$ at the operation step S620.

During the (n−1)th erase loop, i.e., the second to final erase loop, according to the threshold voltage distributions in FIGS. 7(b) and 7(c), it can be determined that the third and the fourth memory blocks pass the (n−1)th erase verification at the operation step S620, i.e., the threshold voltages of the memory cells are lower than the initial erase verification voltage $EV_0$. Next, the threshold voltages of the memory cells in the third and fourth memory blocks are compared again with the first sub-erase verification voltage $EV_1$ at operation step S635, where $$EV_1 = EV_0 - \frac{1}{2}V_{step\_ers}.$$

At operation step S635, a determination is made whether the third memory block in FIG. 7(b) fails the first sub-erase verification because the threshold voltages of all the memory cells of the third memory block are not lower than or equal to the first sub-erase verification voltage $EV_1$. Accordingly, the second sub-erase verification voltage $EV_2$ can be determined as $$EV_2 = EV_1 + \frac{1}{4}V_{step\_ers}.$$

at the operation step S640. Subsequently, the threshold voltages of the memory cells in the third memory block are compared again with the second sub-erase verification voltage $EV_2$. At operation step S650, when it is determined that the third memory block passes the second sub-erase verification, a third sub-erase verification voltage $EV_3$ can be applied to the memory cells of the third memory block at the operation step S655 for comparison with the threshold voltages. The third sub-erase verification voltage $$EV_3 = EV_2 - \frac{1}{8}V_{step\_ers}.$$

At operation step S665, a determination is made whether the third memory block fails the third sub-erase verification because the threshold voltages of all the memory cells are not lower than or equal to the third sub-erase verification voltage $EV_3$. As the maximum number of the sub-erase verifications M is selected as 3 (i.e., M=3) in this example, the second erase step voltage $V_{step\_ers\_2}$ can be determined at operation step S675, i.e., $$V_{step\_ers\_2} = EV_3 - EV + \frac{1}{8}V_{step\_ers}.$$

The erase voltage $V_{erase}(n)$ for the nth erase loop, the final erase loop, can be increased by the second erase step voltage $V_{step\_ers\_2}$, i.e., $V_{erase}(n)=V_{erase}(n-1)+V_{step\_ers\_2}$, where the erase voltage $V_{erase}(n-1)$ was applied to the memory cells of the third memory block during the (n−1)th erase loop at operation step S625. Finally, the erase operation can be performed with the erase voltage $V_{erase}(n)$ such that all the memory cells of the third memory block can be reset to the state ER.

As shown in FIG. 7(c), a determination can be made whether the fourth memory block passes the first sub-erase verification at operation step S635 because the threshold voltages of all the memory cells of the fourth memory block are lower than the first sub-erase verification voltage $EV_1$. Accordingly, the second sub-erase verification voltage $$EV2 = EV1 - \frac{1}{4}V_{step\_ers}$$

is determined at the operation step S645. Subsequently, the threshold voltages of the memory cells in the fourth memory block are compared again with the second sub-erase verification voltage $EV_2$. At operation step S650, when it is determined that the fourth memory block fails the second sub-erase verification, a third sub-erase verification voltage $EV_3$ can be applied to the memory cells of the fourth memory block at the operation step S660. The third sub-erase verification voltage $$EV_3 = EV_2 + \frac{1}{8}V_{step\_ers}.$$

At operation step S665, a determined can be made whether the fourth memory block passes the third sub-erase verification because the threshold voltages of all the memory cells are lower than or equal to the third sub-erase verification voltage $EV_3$. As the maximum number of the sub-erase verifications M=3 has been reached in this example, the second erase step voltage $V_{step\_ers\_2}$ can be determined at operation step S670, i.e., $V_{step\_ers\_2}=EV_3-EV$. The erase voltage $V_{erase}(n)$ for the nth erase loop can be expressed as $V_{erase}(n)=V_{erase}(n-1)+V_{step\_ers\_2}=V_{erase}(n-1)+EV_3-EV$. All the memory cells of the fourth memory block can thereby be reset to the state ER by applying the erase voltage $V_{erase}(n)$ during the nth erase loop.

By adjusting the second erase step voltage $V_{step\_ers\_2}$ for the final (i.e., nth) erase loop according to the threshold voltages of the memory cells, different memory blocks with different erase speeds can be erased at similar erase depth. The states ER of different memory blocks can be controlled within similar proximity to the erase verification voltage EV. The variation of erase depth can be reduced from $$V_{step\_ers} \text{ to } \frac{1}{2^M} V_{step\_ers},$$

where M is the maximum number of sub-erase verifications performed during the second to final (i.e., the (n−1)th) erase loop. As a result, deep erase or shallow erase can be avoided. Problems of reduced read margin caused by shallow erase or deteriorated endurance caused by deep erase can be resolved.

It is noted that the erase and erase verification method described in the present disclosure is not limited to a three-dimensional NAND flash memory or a NAND flash memory. Any memory or storage system using ISPE scheme can adapt the erase and erase verification method described above to achieve improved erase depth.

In summary, the present disclosure provides a method of erase and erase verification for a memory device. The method includes applying a first erase voltage to erase memory cells of the memory device, where the first erase voltage is incrementally increased by a first erase step voltage until the memory cells pass an initial erase verification using an initial erase verification voltage that is higher than an erase verification voltage by the first erase step voltage. After the memory cells pass the initial erase verification, it is determined whether the memory cells pass or fail sub-erase verifications by applying sub-erase verification voltages, where the sub-erase verification voltages are in a range between the erase verification voltage and the initial erase verification voltage. The method also includes applying a second erase voltage to erase the memory cells after the sub-erase verifications. The second erase voltage is increased from the first erase voltage by a second erase step voltage. The second erase step voltage is smaller than the first erase step voltage and is determined according to whether the memory cells pass or fail the sub-erase verifications.

The present disclosure also provides a memory device, which includes a memory block having a plurality of memory cells; and a plurality of word lines and bit lines, wherein each memory cell is coupled to a word line and a bit line. The memory device also includes a control circuit configured to send control signals for performing erase and erase verification operations for the memory block. The control signals when executed cause the memory device to apply a first erase voltage to erase the memory block. The first erase voltage is incrementally increased by a first erase step voltage until the memory block passes an initial erase verification using an initial erase verification voltage that is higher than an erase verification voltage by the first erase step voltage. The control signals when executed also cause the memory device to determine whether the memory block passes or fails sub-erase verifications by applying sub-erase verification voltages after the memory block passes the initial erase verification. The sub-erase verification voltages are in a range between the erase verification voltage and the initial erase verification voltage. The control signals when executed also cause the memory device to apply a second erase voltage to erase the memory block after the sub-erase verifications. The second erase voltage is increased from the first erase voltage by a second erase step voltage that is smaller than the first erase step voltage and is determined according to whether the memory block passes or fails the sub-erase verifications.

The present disclosure further provides a memory system. The memory system includes a memory controller and a NAND flash memory managed by the memory controller. The NAND flash memory includes a memory block having a plurality of memory cells and a plurality of word lines and bit lines, where each memory cell is coupled to a word line and a bit line. The NAND flash memory also includes a control circuit configured to send control signals for performing erase and erase verification operations for the memory block. The control signals, when executed, cause the NAND flash memory to apply a first erase voltage to erase the memory block, where the first erase voltage is incrementally increased by a first erase step voltage until the memory block passes an initial erase verification using an initial erase verification voltage that is higher than an erase verification voltage by the first erase step voltage. The control signals, when executed, also cause the NAND flash memory to determine whether the memory block passes or fails sub-erase verifications by applying sub-erase verification voltages after the memory block passes the initial erase verification. The sub-erase verification voltages are in a range between the erase verification voltage and the initial erase verification voltage. The control signals, when executed, further cause the NAND flash memory to apply a second erase voltage to erase the memory block after the sub-erase verifications, where the second erase voltage is increased from the first erase voltage by a second erase step voltage. The second erase step voltage is smaller than the first erase step voltage and is determined according to whether the memory block passes or fails the sub-erase verifications.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method of erase and erase verification for a memory device, comprising:
    applying a first erase voltage to erase memory cells of the memory device, wherein the first erase voltage is incrementally increased by a first erase step voltage until the memory cells pass an initial erase verification using an initial erase verification voltage that is higher than an erase verification voltage by the first erase step voltage;
    after the memory cells pass the initial erase verification, determining whether the memory cells pass or fail sub-erase verifications by applying sub-erase verification voltages, wherein the sub-erase verification voltages are in a range between the erase verification voltage and the initial erase verification voltage; and
    applying a second erase voltage to erase the memory cells after the sub-erase verifications, wherein the second erase voltage is increased from the first erase voltage by a second erase step voltage that is smaller than the first erase step voltage and is determined according to whether the memory cells pass or fail the sub-erase verifications.

2. The method of claim 1, further comprising:
    after applying the second erase voltage to erase the memory cells, determining whether the memory cells pass or fail an ultimate erase verification using the erase verification voltage.

3. The method of claim 2, further comprising:
    determining that the memory cells fail the initial erase verification when threshold voltages of the memory cells are higher than the initial erase verification voltage; and
    determining that the memory cells fail the ultimate erase verification when the threshold voltages of the memory cells are higher than the erase verification voltage.

4. The method of claim 3, further comprising:
    applying the initial erase verification voltage or the erase verification voltage to word lines coupled to the memory cells.

5. The method of claim 2, further comprising:
    completing the erase and erase verification for the memory device when the memory cells pass the ultimate erase verification.

6. The method of claim 1, wherein the determining whether the memory cells pass or fail sub-erase verifications comprises:
    performing M number of sub-erase verification operations using M number of the sub-erase verification voltages after the memory cells pass the initial erase verification, wherein:
        M is a first whole number not smaller than 1; and
        a first sub-erase verification voltage is the initial erase verification voltage subtracting a half of the first erase step voltage.

7. The method of claim 6, further comprising:
    decreasing an ith sub-erase verification voltage from an (i−1)th sub-erase verification voltage by a first product of the first erase step voltage and $$\frac{1}{2^i}$$

when the memory cells pass an (i−1)th sub-erase verification; and
    increasing the ith sub-erase verification voltage from the (i−1)th sub-erase verification voltage by the first product of $$\frac{1}{2^i}$$

and the first erase step voltage when the memory cells fail the (i−1)th sub-erase verification,
    wherein i is a second whole number greater than 1 but not larger than M.

8. The method of claim 7, further comprising:
    determining that the memory cells fail the (i−1)th sub-erase verification when threshold voltages of the memory cells are higher than the (i−1)th sub-erase verification voltage.

9. The method of claim 7, further comprising:
    determining that the second erase step voltage is an Mth sub-erase verification voltage subtracting the erase verification voltage when the memory cells pass an Mth sub-erase verification; and
    determining that the second erase step voltage is the Mth sub-erase verification voltage subtracting the erase verification voltage and adding a second product of $$\frac{1}{2^M}$$

and the first erase step voltage when the memory cells fail the Mth sub-erase verification.

10. The method of claim 1, wherein the applying the first erase voltage or the second erase voltage to erase the memory cells comprises:
    applying the first erase voltage or the second erase voltage to an array common source of the memory cells; and
    grounding word lines coupled to the memory cells.

11. A memory device, comprising:
    a memory block comprising a plurality of memory cells;
    a plurality of word lines and bit lines, wherein each memory cell in the plurality of memory cells is coupled to a word line and a bit line in the plurality of word lines and bit lines; and
    a control circuit configured to send control signals for performing erase and erase verification operations for the memory block, wherein the control signals when executed cause the memory device to:
        apply a first erase voltage to erase the memory block, wherein the first erase voltage is incrementally increased by a first erase step voltage until the memory block passes an initial erase verification using an initial erase verification voltage that is higher than an erase verification voltage by the first erase step voltage;

after the memory block passes the initial erase verification, determine whether the memory block passes or fails sub-erase verifications by applying sub-erase verification voltages, wherein the sub-erase verification voltages are in a range between the erase verification voltage and the initial erase verification voltage; and apply a second erase voltage to erase the memory block after the sub-erase verifications, wherein the second erase voltage is increased from the first erase voltage by a second erase step voltage that is smaller than the first erase step voltage and is determined according to whether the memory block passes or fails the sub-erase verifications.

12. The memory device of claim 11, wherein the memory block is determined to pass or fail an ultimate erase verification by using the erase verification voltage after the memory block is erased by applying the second erase voltage.

13. The memory device of claim 12, wherein the memory block fails the initial erase verification when threshold voltages of a predetermined number of memory cells in the memory block are higher than the initial erase verification voltage; and the memory block fails the ultimate erase verification when the threshold voltages of the predetermined number of memory cells are higher than the erase verification voltage.

14. The memory device of claim 13, wherein the initial erase verification voltage or the erase verification voltage is applied to the plurality of word lines coupled to the plurality of memory cells.

15. The memory device of claim 12, wherein the erase and erase verification operations for the memory device are completed when the memory block passes the ultimate erase verification.

16. The memory device of claim 11, wherein the sub-erase verifications comprise M number of sub-erase verification operations and the sub-erase verification voltages comprise M number of the sub-erase verification voltages, wherein M is a first whole number not smaller than 1 and a first sub-erase verification voltage is the initial erase verification voltage subtracting a half of the first erase step voltage.

17. The memory device of claim 16, wherein:
an ith sub-erase verification voltage is an (i−1)th sub-erase verification voltage subtracting a first product of $$\frac{1}{2^i}$$

and the first erase step voltage when the memory block passes an (i−1)th sub-erase verification; and
the ith sub-erase verification voltage is the (i−1)th sub-erase verification voltage adding the first product of $$\frac{1}{2^i}$$

and the first erase step voltage when the memory block fails the (i−1)th sub-erase verification,
wherein i is a second whole number larger than 1 but not larger than M.

18. The memory device of claim 17, wherein:
the second erase step voltage is an Mth sub-erase verification voltage subtracting the erase verification voltage when the memory block passes an Mth sub-erase verification; and
the second erase step voltage is the Mth sub-erase verification voltage subtracting the erase verification voltage and adding a second product of $$\frac{1}{2^M}$$

and the first erase step voltage when the memory block fails the Mth sub-erase verification.

19. The memory device of claim 17, wherein the memory block fails an (m−1)th sub-erase verification when threshold voltages of a predetermined number of memory cells in the memory block are higher than a (m−1)th sub-erase verification voltage.

20. A memory system, comprising:
a memory controller; and
a NAND flash memory managed by the memory controller, the NAND flash memory comprising:
a memory block comprising a plurality of memory cells;
a plurality of word lines and bit lines, wherein each memory cell in the plurality of memory cells is coupled to a word line and a bit line in the plurality of word lines and bit lines; and
a control circuit configured to send control signals for performing erase and erase verification operations for the memory block, the control signals when executed cause the NAND flash memory to:
apply a first erase voltage to erase the memory block, wherein the first erase voltage is incrementally increased by a first erase step voltage until the memory block passes an initial erase verification using an initial erase verification voltage that is higher than an erase verification voltage by the first erase step voltage;
after the memory block passes the initial erase verification, determine whether the memory block passes or fails sub-erase verifications by applying sub-erase verification voltages, wherein the sub-erase verification voltages are in a range between the erase verification voltage and the initial erase verification voltage; and
apply a second erase voltage to erase the memory block after the sub-erase verifications, wherein the second erase voltage is increased from the first erase voltage by a second erase step voltage that is smaller than the first erase step voltage and is determined according to whether the memory block passes or fails the sub-erase verifications.

* * * * *